United States Patent
Tran

(10) Patent No.: US 7,576,568 B1
(45) Date of Patent: Aug. 18, 2009

(54) SELF-SELECTING PRECHARGED DOMINO LOGIC CIRCUIT

(75) Inventor: Hiep V. Tran, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 08/938,163

(22) Filed: Sep. 26, 1997

(51) Int. Cl.
    *H03K 19/20* (2006.01)
(52) U.S. Cl. ........................................ 326/121; 326/93
(58) Field of Classification Search .............. 326/93–98, 326/112, 119, 121
    See application file for complete search history.

(56) References Cited

U.S. PATENT DOCUMENTS

| | | | | |
|---|---|---|---|---|
| 4,700,086 A | * | 10/1987 | Ling et al. | 326/98 |
| 4,914,326 A | * | 4/1990 | Kikuda et al. | 326/121 |
| 5,015,890 A | * | 5/1991 | Murakami et al. | 326/121 |
| 5,457,404 A | * | 10/1995 | Sharpe-Geisler | 326/98 |
| 5,831,452 A | * | 11/1998 | Nowak et al. | 326/98 |

* cited by examiner

*Primary Examiner*—Don P Le
(74) *Attorney, Agent, or Firm*—Wade J. Brady, III; Frederick J. Telecky, Jr.

(57) ABSTRACT

A domino logic circuit having an input terminal and a precharge node. A first switch is responsive to a second switch sensing one of a high or low voltage at the precharge node to charge the precharge node and the second switch is responsive to the one of a high or low voltage at the precharge node to control the first switch charging the precharge node. The first switch is preferably a p-channel transistor and the second switch is preferably an n-channel transistor. The circuit also includes an output terminal, an inverter coupled between the precharge node and the output terminal and feedback circuitry coupled between the output terminal and coupled to the second switch to provide the charge state of the precharge node to the second switch. The circuit further includes a pair of transistors having serially connected current paths, the serially connected current paths being coupled between the precharge node and a reference source.

29 Claims, 2 Drawing Sheets

US 7,576,568 B1

SELF-SELECTING PRECHARGED DOMINO LOGIC CIRCUIT

BACKGROUND OF THE INVENTION

1. Field of the Invention

This invention relates to domino logic circuits and, more specifically, to such circuits which are selectively precharged.

2. Brief Description of the Prior Art

Domino logic circuits are well known in the art and generally include in series between a source of power and reference voltage, a first transistor of one of n-channel or p-channel and preferably p-channel, one or more serially connected second transistors of the other of n-channel or p-channel and a third transistor of the same type as the second transistor(s). An output is taken from the node at the junction of the first transistor and second transistor(s) and inverted by an inverter. During the precharge operation, the first transistor is normally conducting and the second and third transistors are normally non-conducting to provide a high signal at the precharge node at the junction of the first transistor and second transistor(s) and a low signal at the inverter output, this being the precharging phase of operation. If the second and third transistors are all then concurrently activated and the first transistor is deactivated, the voltage at the node at the junctions of the first transistor and second transistor(s) will go low whereas that node will remain high if any of second or third transistors is not activated after precharge. The output of the inverter is the inverse of the voltage at the node. It is therefore apparent that the voltage at the precharge node will not change appreciably if any of the one or more second transistors are not activated in the cycle prior to the next precharge.

Domino logic circuits are generally used in circuitry containing many such circuits, such as, for example, in matrix arrangements or the like wherein only one of plural such logic circuits will be activated at any one time with the other logic circuit being unactivated. It follows that power is wasted whenever a precharge voltage is applied to the precharge node of a logic circuit which has not been activated when the precharge node is already at the high voltage.

SUMMARY OF THE INVENTION

In accordance with the present invention, the above described problem inherent in the prior art domino logic circuits is minimized and there are provided domino logic circuits wherein power is not applied to the precharge node at the junction of the first and second transistors when the voltage at that node is already sufficiently high.

Briefly, the above noted problem is minimized by sensing the status (high or low) at the output of the domino logic circuit and providing a switch in series with the input to the control electrode of the first transistor of the domino logic circuit which is controlled in response to the status of the logic circuit output to isolate the precharging signal from the first transistor when the precharge node is charged to a sufficiently high voltage. In addition, there are optionally provided transistors of the same type as the first transistor, one of which is coupled between a power source and the gate of the first transistor and the other is coupled between a source of power and the precharge node, each of these optional transistors being controlled by the signal at the output node. It can be seen that these optional transistors are activated when the signal at the output node is low to provide a high signal at the gate of the first transistor and at the precharge node. This insures that the first transistor is maintained in the deactivated condition, especially when the gate electrode of the first transistor would otherwise be floating and that the precharge node is maintained with a high signal.

As a further embodiment of the invention, the above described circuit is altered so that the gate of the third transistor is coupled to the gate of the first transistor. In this way, when the first transistor is activated, the third transistor is deactivated and vice versa.

In accordance with a still further embodiment of the invention, the circuit is identical to that of the paragraph immediately above except that the switch is replaced by a CMOS arrangement composed of an n-channel transistor and a p-channel transistor with the n-channel transistor performing the same operation as switch and being connected in the same manner whereas the gate of the p-channel transistor is coupled to the precharge node. Since the signal on the precharge node is high when the signal on the output node is low and vice versa, and since the n-channel transistor forming a part of the switch is rendered conductive by a high signal whereas the p-channel transistor forming the switch is rendered conductive by a low signal, it follows that the addition of the p-channel transistor provides a redundant check on the operation of inverter.

In accordance with a yet further embodiment of the invention, the circuit of the first embodiment is altered by replacing the optional transistor coupled to the precharge node with a feedback inverter which feeds back an inversion of the signal at the output node to the precharge node and by connecting the gate of the third transistor to the PC bar input line coupled to the switch.

DESCRIPTION OF THE PREFERRED EMBODIMENTS

Figure 1:
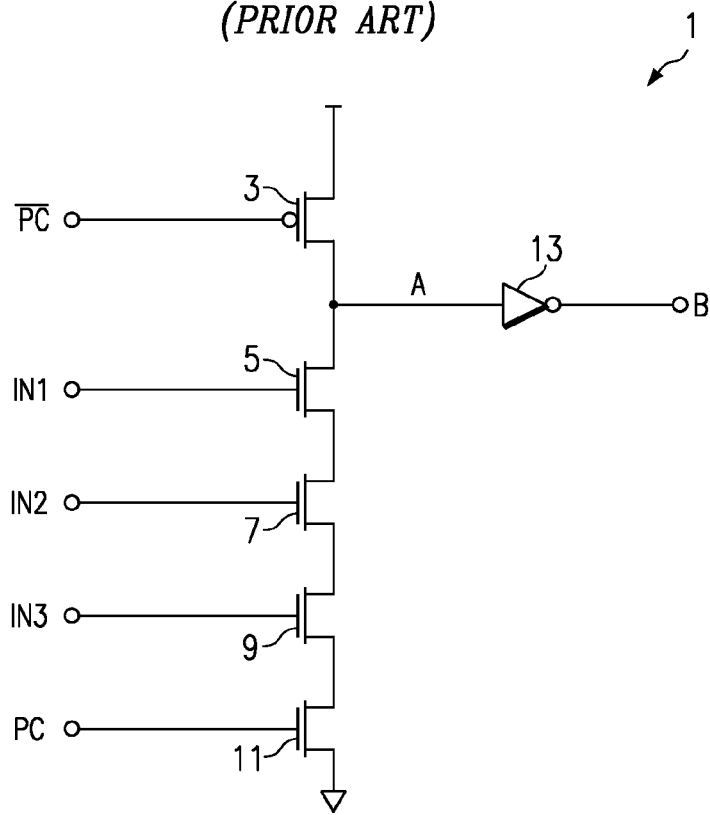
FIG. 1 is a circuit diagram of a domino logic circuit in accordance with the prior art.
Figure 2:
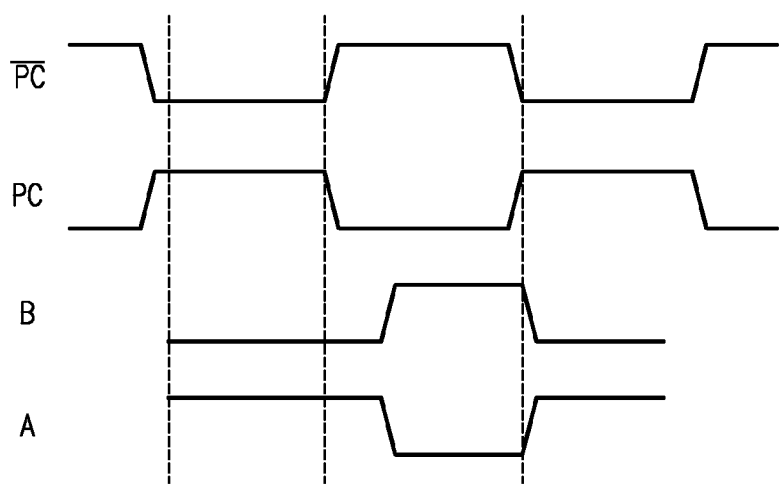
FIG. 2 is a timing diagram for the circuit of FIG. 1.

Referring to FIGS. 1 and 2, there is shown a typical prior art domino logic circuit 1 having, connected in series between $V_{DD}$ and reference voltage, an n-channel transistor 3 and p-channel transistors 5, 7, 9 and 11. Transistors 5, 7 and 9 are coupled to inputs and, as shown, act as a gate circuit. It should be understood that there can be one or more such transistors 5, 7, 9 with inputs and the fact that the circuit is shown with three such transistors is of no significance. The output of the circuit is provided at the junction of transistors 3 and 5 which is denoted as node A, the signal at node A being inverted by an inverter 13 to provide an inverted output at node B.

In operation, when the PC bar signal goes low, as shown in FIG. 2, and with one or more of transistors 5, 7, 9 and 11 inactivated, transistor 3 conducts and node A goes high with inverter 13 causing node B to go low. After a short period of time, the PC bar signal goes high and node A remains high. Subsequently, when the PC signal goes high and if the inputs to transistors 5, 7 and 9 are also high at that time, node A will go low and node B will go high. If one or more of transistors 5, 7 and 9 is not activated, node A remains high. It follows that any precharging of node A when one or more of transistors 5, 7 and 9 is not activated is often unnecessary unless the charge at node A has dissipated over time for some reason.

Figure 3:
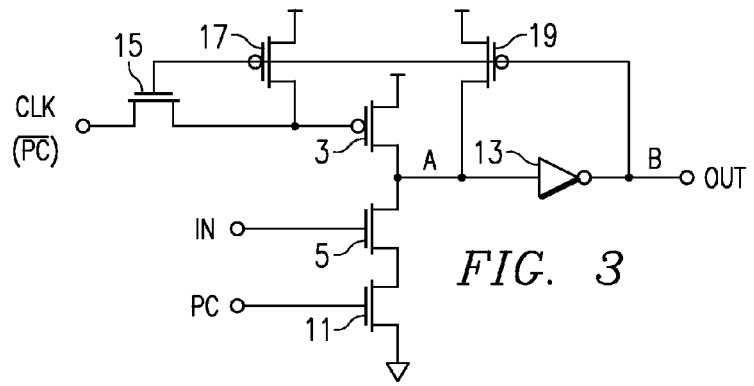
FIG. 3 is a circuit diagram of a domino logic circuit in accordance with a first embodiment of the present invention.

Referring now to FIG. 3, there is shown a first embodiment of a domino logic circuit in accordance with the present invention wherein an n-channel transistor 15 is provided in series with the gate or control electrode of transistor 3 of FIG. 1 and the gate electrode of transistor 15 is coupled to receive the signal which is fed back from node B of FIGS. 1 and 3. In this way, when the circuit is in the precharged state, node A will be high and node B will be low, thereby causing transistor 15 to be inactivated. When node B goes high, transistor 15 is activated and permits the next precharging signal, PC bar, to cause activation of transistor 3 to cause node A to go high. It can be seen that precharging takes place only when necessary, thereby providing a saving of power. In addition, as shown in FIG. 3, there are optionally provided a p-channel transistor 17 which is coupled between a power source and the gate of transistor 3 and a p-channel transistor 19 which is coupled between a source of power and node A, each or transistors 17 and 19 being controlled by the signal at node B. It can be seen that transistors 17 and 19 are activated when the signal at node B is low to provide a high signal at the gate of transistor 3 and at node A. This insures that transistor 3 is maintained in the deactivated condition, especially when the gate of transistor 3 would otherwise be floating and that node A is maintained with a high signal.

Figure 4:
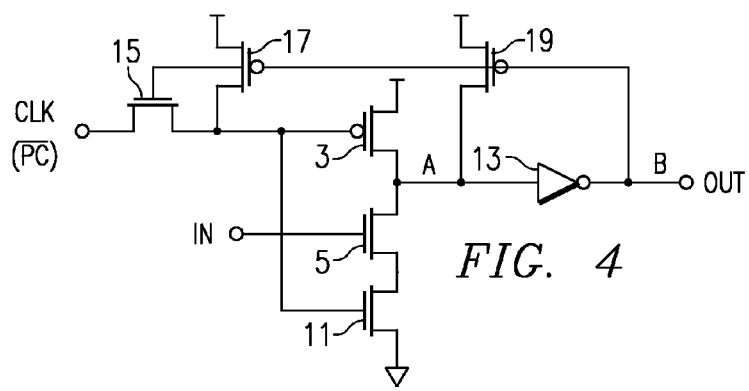
FIG. 4 is a circuit diagram of a domino logic circuit in accordance with a second embodiment of the present invention.

Referring now to FIG. 4, the circuit is identical to that of FIG. 3 except that the gate of transistor 11 is coupled to the gate of transistor 3. In this way, when transistor 3 is activated, transistor 11 is deactivated and vice versa.

Figure 5:
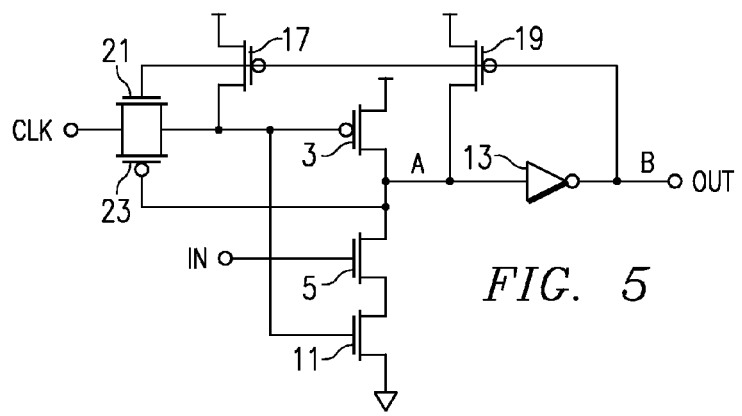
FIG. 5 is a circuit diagram of a domino logic circuit in accordance with a third embodiment of the present invention.

Referring to FIG. 5, the circuit is identical to that of FIG. 4 except that transistor 15 is replaced by a CMOS arrangement composed of n-channel transistor 21 and p-channel transistor 23 with transistor 21 performing the same operation as transistor 15 and being connected in the same manner whereas the gate of transistor 23 is coupled to node A. Since the signal on node A is high when the signal on node B is low and vice versa, and since transistor 21 is rendered conductive by a high signal whereas transistor 23 is rendered conductive by a low signal, it follows that the addition of transistor 23 provides a redundant check on the operation of inverter 13.

Figure 6:
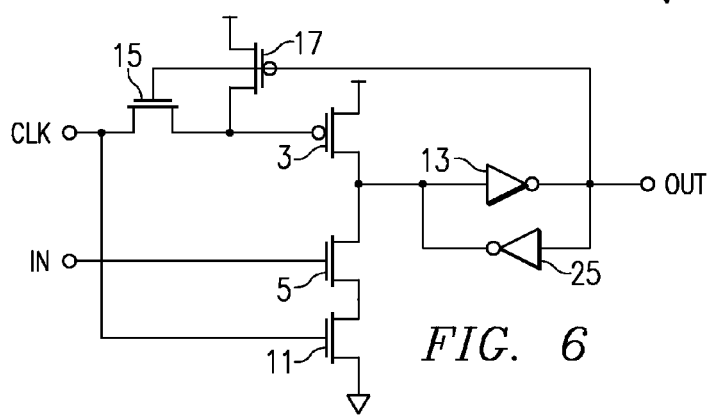
FIG. 6 is a circuit diagram of a domino logic circuit in accordance with a fourth embodiment of the present invention.

Referring now to FIG. 6, the circuit of FIG. 3 is altered by replacing transistor 19 with a feedback inverter 25 which feeds back an inversion of the signal at node B to node A and by connecting the gate of transistor 11 to the PC bar line.

Though the invention has been described with respect to specific preferred embodiments thereof, many variations and modifications will immediately become apparent to those skilled in the art. For example, although each of the embodiments of FIGS. 3 to 6 shows only a single n-channel transistor 5 connected between node A and transistor 11, it is understood that one or more additional n-channel transistors could be connected in series with transistor 5 between node A and transistor 11 in a manner similar to transistors 7 and 9 of FIG. 1. It is therefore the intention that the appended claims be interpreted as broadly as possible in view of the prior art to include all such variations and modifications.

The invention claimed is:
1. A logic circuit which comprises:
   (a) a precharge node for retaining one of a high signal state and a relatively low signal;
   (b) an input terminal;
   (c) a first transistor of one of n-channel or p-channel type having a control electrode and a current path coupled between a source of power and said precharge node;
   (d) a second transistor of the other of n-channel or p-channel type having a current path coupled between said input terminal and said control electrode of said first transistor and a control electrode; and
   (e) circuitry coupled to said control electrode of said second transistor and responsive to one of said high signal and said low signal at said precharge node to control current flow in said current path of said second transistor.

2. The circuit of claim 1 further including a pair of transistors having serially connected current paths, said serially connected current paths being coupled between said precharge node and a reference source.

3. The circuit of claim 1 wherein said circuitry coupled to said control electrode of said second transistor and responsive to the state of said precharge node includes an inverter having an input coupled to said precharge node and an output and a feedback circuit coupled between said output and said control electrode of said second transistor.

4. The circuit of claim 2 wherein said circuitry coupled to said control electrode of said second transistor and responsive to the status of said precharge node includes an inverter having an input coupled to said precharge node and an output and a feedback circuit coupled between said output and said control electrode of said second transistor.

5. The circuit of claim 1 wherein said circuitry coupled to said control electrode of said second transistor and responsive to one of said high signal and said low signal at said precharge node includes an inverter having an input coupled to said precharge node and an output and a feedback circuit coupled between said output and said control electrode of said second transistor.

6. The circuit of claim 4 wherein said circuitry coupled to said control electrode of said second transistor and responsive to one of said high signal and said low signal at said precharge node includes an inverter having an input coupled to said precharge node and an output and a feedback circuit coupled between said output and said control electrode of said second transistor.

7. The circuit of claim 6 further including a third transistor of said one of n-channel or p-channel type coupled between a source of power and said control electrode of said second transistor and responsive to a said low signal at said output terminal to maintain said first transistor in an inactivated state.

8. The circuit of claim 6 further including a fourth transistor of said one of n-channel or p-channel type coupled between a source of power and said precharge node and responsive to said low signal at said output terminal to maintain said precharge node at said high signal state.

9. The circuit of claim 7 further including a fourth transistor of said one of n-channel or p-channel type coupled between a source of power and said precharge node and responsive to said low signal at said output terminal to maintain said precharge node at said high signal state.

10. The circuit of claim 2 wherein the control electrode of one of said pair of transistors is coupled to said control electrode of said first transistor.

11. The circuit of claim 7 wherein the control electrode of one of said pair of transistors is coupled to said control electrode of said first transistor.

12. A logic circuit which comprises:
   a precharge node for retaining one of a high signal state and a relatively low signal;
   an input terminal;

a first transistor of one of n-channel or p-channel type
   having a control electrode and a current path coupled
   between a source of power and said precharge terminal;
a second transistor of the other of n-channel or p-channel
   type having a current path coupled between said input
   terminal and said control electrode of said first transistor
   and a control electrode;
circuitry coupled to said control electrode of said second
   transistor and responsive to one of said high signal and
   said low signal at said precharge node to control current
   flow in said current path of said second transistor; and
a pair of transistors having serially connected current
   paths, said serially connected current paths being
   coupled between said precharge node and a reference
   source;
the control electrode of one of said pair of transistors being
   coupled to said control electrode of said first transistor;
further including a fifth transistor of said one of n-channel
   or p-channel type having a current path in parallel with
   said second transistor and a control electrode coupled to
   said precharge node.
13. A logic circuit which comprises:
a precharge node for retaining one of a high signal state and
   a relatively low signal;
an input terminal;
a first transistor of one of n-channel or p-channel type
   having a control electrode and a current path coupled
   between a source of power and said precharge terminal;
a second transistor of the other of n-channel or p-channel
   type having a current path coupled between said input
   terminal and said control electrode of said first transistor
   and a control electrode; and
circuitry coupled to said control electrode of said second
   transistor and responsive to one of said high signal and
   said low signal at said precharge node to control current
   flow in said current path of said second transistor;
the control electrode of one of said pair of transistors being
   coupled to said control electrode of said first transistor;
said circuitry coupled to said control electrode of said
   second transistor and responsive to the status of said
   precharge node includes an inverter having an input
   coupled to said precharge node and an output and a
   feedback circuit coupled between said output and said
   control electrode of said second transistor;
said circuitry coupled to said control electrode of said
   second transistor and responsive to one of said high
   signal and said low signal at said precharge node
   includes an inverter having an input coupled to said
   precharge node and an output and a feedback circuit
   coupled between said output and said control electrode
   of said second transistor;
a third transistor of said one of n-channel or p-channel type
   coupled between a source of power and said control
   electrode of said second transistor and responsive to a
   said low signal at said output terminal to maintain said
   first transistor in an inactivated state;
further including a fifth transistor of said one of n-channel
   or p-channel type having a current path in parallel with
   said second transistor and a control electrode coupled to
   said precharge node.
14. A logic circuit which comprises:
a precharge node for retaining one of a high signal state and
   a relatively low signal;
an input terminal;
a first transistor of one of n-channel or p-channel type
   having a control electrode and a current path coupled
   between a source of power and said precharge terminal;

a second transistor of the other of n-channel or p-channel
   type having a current path coupled between said input
   terminal and said control electrode of said first transistor
   and a control electrode;
circuitry coupled to said control electrode of said second
   transistor and responsive to one of said high signal and
   said low signal at said precharge node to control current
   flow in said current path of said second transistor; and
a pair of transistors having serially connected current
   paths, said serially connected current paths being
   coupled between said precharge node and a reference
   source;
said circuitry coupled to said control electrode of said
   second transistor and responsive to the status of said
   precharge node including an inverter having an input
   coupled to said precharge node and an output and a
   feedback circuit coupled between said output and said
   control electrode of said second transistor;
wherein the control electrode of one of said pair of transistors is coupled to a portion of a current path to said
   second transistor remote from said first transistor and
   further including a second inverter coupled to transmit
   current therethrough from said output of said inverter to
   said precharge node.
15. A domino logic circuit which comprises:
(a) an input terminal;
(b) a precharge node;
(c) a first switch responsive to a second switch sensing one
   of a high or low voltage at said precharge node to charge
   said precharge node; and
(d) said second switch responsive to said one of a high or
   low voltage at said precharge node to control said first
   switch charging said precharge node.
16. The circuit of claim 15 wherein said first switch is a p-channel transistor and said second switch is an n-channel transistor.
17. The circuit of claim 15 further including an output terminal, an inverter coupled between said precharge node and said output terminal and feedback circuitry coupled between said output terminal and coupled to said second switch to provide said charge state of said precharge node to said second switch.
18. The circuit of claim 16 further including an output terminal, an inverter coupled between said precharge node and said output terminal and feedback circuitry coupled between said output terminal and coupled to said second switch to provide said charge state of said precharge node to said second switch.
19. The circuit of claim 15 further including a pair of transistors having serially connected current paths, said serially connected current paths being coupled between said precharge node and a reference source.
20. The circuit of claim 18 further including a pair of transistors having serially connected current paths, said serially connected current paths being coupled between said precharge node and a reference source.
21. A dynamic logic circuit, comprising:
a precharge transistor connected to a power source for
   precharging a node for indicating a first logic level upon
   receiving a precharge signal;
discharge means for discharging said node to indicate a
   second logic level; and
a switch for connecting said precharge signal to said precharge transistor, said switch connected to pass said
   precharge signal to said precharge transistor if said node
   has been previously discharged to said second logic
   state.

22. A dynamic logic circuit as recited in claim 21, further comprising:
a keeper transistor connected between said power source and a gate of said precharge transistor for keeping said node at said first logic level prior to discharging with said discharging means.

23. A dynamic logic circuit as recited in claim 22 wherein a gate of said keeper transistor is connected to an output of said dynamic logic circuit.

24. A dynamic logic circuit as recited in claim 22, further comprising a half keeper latch comprising a transistor connected between said power source and said node and having a gate connected to an output of said dynamic logic circuit.

25. A dynamic logic circuit as recited in claim 23, further comprising a full keeper latch comprising:
a first transistor connected between said power source and said node and having a gate connected to an output of said dynamic logic circuit; and
a second transistor connected between said node and electrical ground, and having a gate connect to said output of said dynamic logic circuit.

26. A dynamic logic circuit as recited in claim 21 wherein said discharge means comprises a series of transistors for realizing a logical AND function.

27. A precharge circuit for a dynamic CMOS circuit, comprising:
a precharge node for holding a first voltage level indicating a first logic state;
a precharge transistor connected between said precharge node and a voltage source;
a keeper transistor connected between a gate of said precharge transistor and said voltage source for keeping said precharge node at said first voltage level indicating said first logic state prior to discharge; and
a switching transistor controlled by a feedback signal indicating a logic state of said precharge node; said switching transistor activating said precharge transistor during a stand-by cycle only if said precharge node has been previously discharged to a second voltage level indicating a second logic state.

28. A precharge circuit for a dynamic CMOS circuit as recited in claim 27 wherein a gate of said keeper transistor is connected to an output of said dynamic logic circuit.

29. A method of precharging a dynamic CMOS circuit, comprising the steps of:
precharging a node to a high voltage level indicating a first logic state during a stand-by mode;
discharging said node with connected logic circuitry if said logic circuitry is activated during an active mode;
precharging said node during a subsequent stand-by mode if said node was discharged during said discharging step; and
inhibiting the precharging of said node during said subsequent stand-by mode if said node remains precharged from a previous standby mode.

* * * * *